US012317407B2

(12) United States Patent
Lee et al.

(10) Patent No.: US 12,317,407 B2
(45) Date of Patent: May 27, 2025

(54) ELECTRONIC DEVICE INCLUDING PRINTED CIRCUIT BOARD STRUCTURE INCLUDING THERMAL INTERFACE MATERIAL

(71) Applicant: SAMSUNG ELECTRONICS CO., LTD., Suwon-si (KR)

(72) Inventors: Kyuhwan Lee, Suwon-si (KR); Min Park, Suwon-si (KR); Haejin Lee, Suwon-si (KR); Jaeheung Ye, Suwon-si (KR); Yeonkyung Chung, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 212 days.

(21) Appl. No.: 18/091,368

(22) Filed: Dec. 30, 2022

(65) Prior Publication Data

US 2023/0156902 A1 May 18, 2023

Related U.S. Application Data

(63) Continuation of application No. PCT/KR2022/016857, filed on Nov. 1, 2022.

(30) Foreign Application Priority Data

Nov. 12, 2021 (KR) .................. 10-2021-0155899
Dec. 7, 2021 (KR) .................. 10-2021-0173996

(51) Int. Cl.
*H05K 1/02* (2006.01)
*H05K 7/20* (2006.01)

(52) U.S. Cl.
CPC ....... *H05K 1/0203* (2013.01); *H05K 7/20463* (2013.01); *H05K 2201/10378* (2013.01)

(58) Field of Classification Search
CPC . H05K 7/20454–20463; H05K 1/0203; H05K 2201/10378
See application file for complete search history.

(56) References Cited

U.S. PATENT DOCUMENTS 5,009,311 A * 4/1991 Schenk ............... H05K 3/284
206/706
6,547,063 B1 * 4/2003 Zaveri ................ A45D 27/02
206/568

(Continued)

FOREIGN PATENT DOCUMENTS

JP 2009-231351 A 10/2009
JP 2012-253104 A 12/2012

(Continued)

OTHER PUBLICATIONS

Written Opinion of the International Searching Authority for PCT/KR2022/016857 (Feb. 7, 2023).*

(Continued)

*Primary Examiner* — Zachary Pape
(74) *Attorney, Agent, or Firm* — CANTOR COLBURN LLP

(57) ABSTRACT

An electronic device includes a printed circuit board ("PCB") structure which accommodates a thermal interface material ("TIM"). The PCB structure includes a base plate, a first component on the base plate, a second component on the base plate and apart from the first component, an interposer connected to the base plate and surrounding the first component and the second component, a cover plate connected to the interposer and covering the first component and the second component, and an accommodation part which is between the base plate and a heat conduction plate and accommodates the TIM.

18 Claims, 8 Drawing Sheets

(56) References Cited

U.S. PATENT DOCUMENTS

| 9,686,853 | B2 | | 6/2017 | Chainer et al. |
| 10,111,363 | B2 | * | 10/2018 | Chen .................. B23P 15/26 |
| 2008/0151503 | A1 | * | 6/2008 | Aapro ................ H04M 1/026 |
| | | | | 361/714 |
| 2012/0205792 | A1 | | 8/2012 | Sugaya |
| 2014/0340848 | A1 | | 11/2014 | Vos |
| 2019/0278343 | A1 | * | 9/2019 | Cinar ................ G06F 1/3275 |

FOREIGN PATENT DOCUMENTS

| JP | 5521546 B2 | 6/2014 |
| KR | 10-2004-0006636 A | 1/2004 |
| KR | 10-2010-0101194 A | 9/2010 |
| KR | 10-2020-0045261 A | 5/2020 |
| KR | 10-2021-0058074 A | 5/2021 |

OTHER PUBLICATIONS

International Search Report mailed Feb. 7, 2023 for PCT/KR2022/016857, citing the above reference(s). In conformance with MPEP 609—Concise explanation of the relevance includes issue date of a foreign OA and references cited therein.

* cited by examiner

ELECTRONIC DEVICE INCLUDING PRINTED CIRCUIT BOARD STRUCTURE INCLUDING THERMAL INTERFACE MATERIAL

CROSS-REFERENCE TO RELATED APPLICATIONS

This application is a PCT-Bypass application of International Application No. PCT/KR2022/016857 designating the United States, filed on Nov. 1, 2022, which claims priority to Korean Patent Application No. 10-2021-0155899, filed on Nov. 12, 2021, and Korean Patent Application No. 10-2021-0173996, filed on Dec. 7, 2021, in the Korean Intellectual Property Office, the contents of which in their entireties are herein incorporated by reference.

BACKGROUND

1. Field

The disclosure relates to an electronic device, e.g., to an electronic device including a printed circuit board structure for accommodating a thermal interface material.

2. Description of Related Art

An electronic device may generate a large amount of heat when performing various functions at a high performance. The heat conduction performance of the electronic device is desired to secure product stability and reliability. Accordingly, technology for conducting internal heat of the electronic device in a limited space is being actively studied.

A method of injecting a liquid thermal interface material ("TIM") into an inner space of the electronic device and hardening the injected TIM is known technology for conducting heat.

SUMMARY

A range of use of electronic devices has expanded, and an increasing number of programs and applications demand high specifications. An application processor ("AP") consumes increasingly large power to improve the performance of an electronic device. Heat generated by the electronic device may adversely affect the performance of electronic device and may be a risk to the safety of a user. Injecting a liquid thermal interface material ("TIM") inside the electronic device is known technology for resolving issues of increased power consumption of the AP and increased heat from inside the electronic device. An inlet is desired to inject a TIM inside the electronic device.

When injecting the liquid TIM by forming the inlet in a surface for accommodating components, the liquid TIM may not be effectively injected because the injected direction and moving direction of the liquid TIM are not the same as one another and rather perpendicular. When using a more fluid liquid TIM for more effective injection, heat conductivity may decrease.

In addition, when directly injecting the liquid TIM inside the electronic device and hardening the liquid TIM, the injected liquid TIM may not be practically removed. In this case, components, to which the hardened TIM is attached, may not be easily replaced.

Embodiments of the disclosure provide an electronic device including a structure in which components included in the electronic device may be easily maintained, repaired, and/or replaced after a liquid TIM is hardened while increasing the injectability of the liquid TIM.

In an embodiment, an electronic device includes a printed circuit board ("PCB") structure accommodating a TIM, in which the PCB structure includes a base plate, a first component on the base plate, a second component on the base plate and apart from the first component, an interposer connected to the base plate and surrounding the first component and the second component, a cover plate connected to the interposer and covering the first component and the second component, and an accommodation part which is between the base plate and a heat conduction plate and accommodates the TIM.

In an embodiment, an electronic device includes a PCB structure accommodating a TIM, in which the PCB structure includes a base plate, a first component on the base plate, a second component on the base plate and apart from the first component, an interposer connected to the base plate and surrounding the first component and the second component, a cover plate connected to the interposer and covering the first component and the second component, a heat conduction plate on the cover plate and facing the first component and the second component, an accommodation part which is between the base plate and the heat conduction plate, and a TIM accommodated in the accommodation part and provided in a solid state by being hardened in the accommodation part.

By embodiments, an electronic device includes a PCB structure, in which the PCB structure includes a base plate, a first component on the base plate, a second component on the base plate and apart from the first component, an interposer body connected to the base plate and surrounding the first component and the second component and an interposer disposed in the interposer body and including an inlet through which an inner space of the interposer body meets the outside, a cover plate connected to the interposer and covering the first component and the second component, a heat conduction plate on the cover plate and facing the first component and the second component, an accommodation part including an accommodation body and an accommodation head extending from the accommodation body and included inside the inlet, in which the accommodation body is between the base plate and the heat conduction plate, and a TIM accommodated in the accommodation part and provided in a solid state by being hardened in the accommodation part.

By embodiments, an electronic device including a PCB structure accommodating a TIM may increase the injectability of the TIM by injecting a liquid TIM inside the electronic device through an inlet included in an interposer such that the injected direction and moving direction of the liquid TIM approximately are parallel to one another.

By embodiments, an electronic device including a PCB structure accommodating a TIM may easily maintain, repair, and/or replace components included in the electronic device because the electronic device accommodates the TIM by an accommodation part.

In addition, various effects directly or indirectly ascertained through the disclosure may be provided.

BRIEF DESCRIPTION OF THE DRAWINGS

The above and other features and advantages of predetermined embodiments of the disclosure will be more apparent from the following detailed description, taken in conjunction with the accompanying drawings, in which.

DETAILED DESCRIPTION

Figure 1:
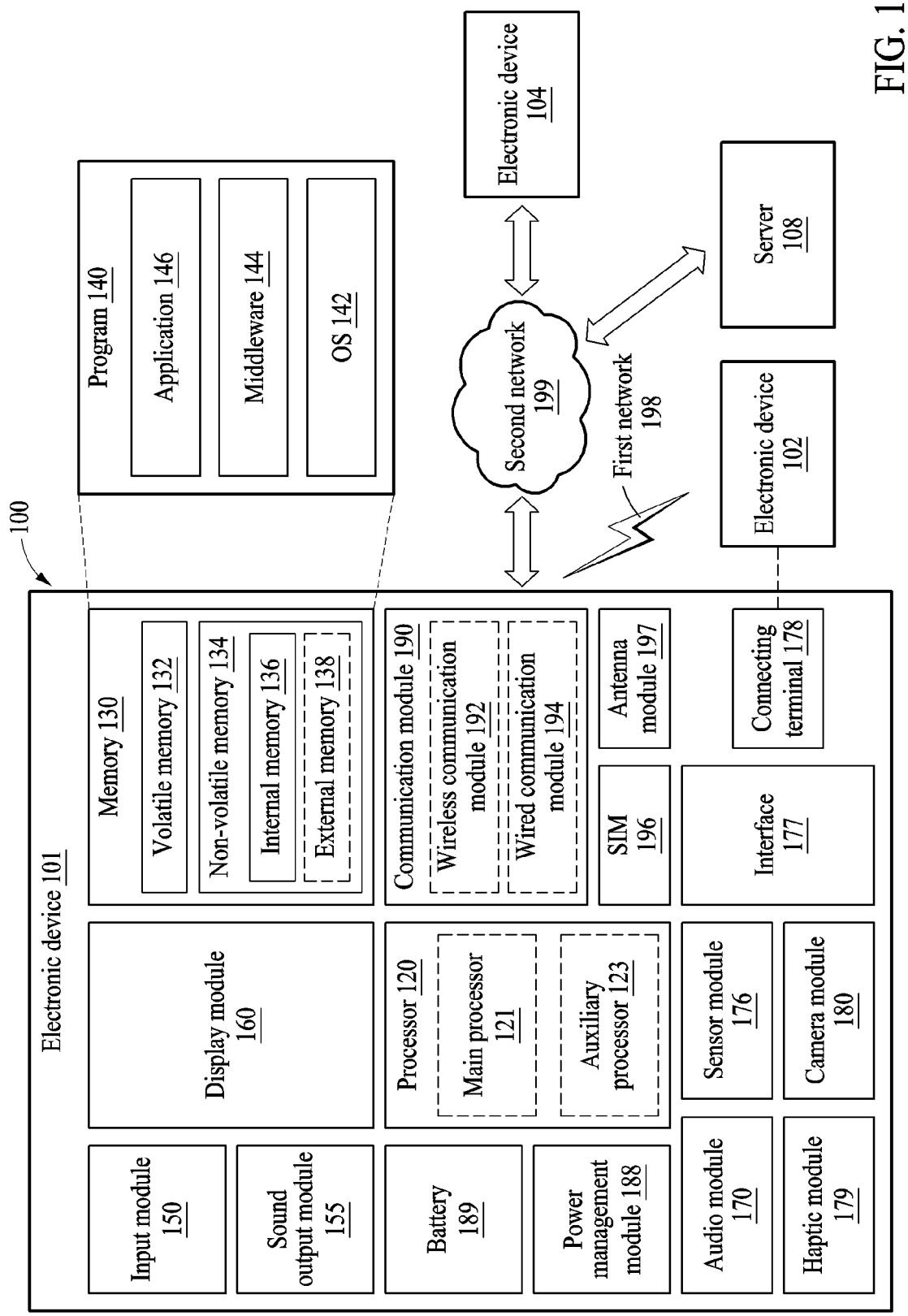
FIG. 1 is a block diagram illustrating an embodiment of an electronic device in a network environment.

Hereinafter, embodiments will be described in detail with reference to the accompanying drawings. When describing the embodiments with reference to the accompanying drawings, like reference numerals refer to like elements and a repeated description related thereto will be omitted.

FIG. 1 is a block diagram illustrating an electronic device 101 in a network environment 100 in various embodiments. Referring to FIG. 1, the electronic device 101 in the network environment 100 may communicate with an electronic device 102 via a first network 198 (e.g., a short-range wireless communication network), or communicate with at least one of an electronic device 104 and a server 108 via a second network 199 (e.g., a long-range wireless communication network). In an embodiment, the electronic device 101 may communicate with the electronic device 104 via the server 108. In an embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module ("SIM") 196, or an antenna module 197. In some embodiments, at least one of the components (e.g., the connecting terminal 178) may be omitted from the electronic device 101, or one or more other components may be added to the electronic device 101. In some embodiments, some of the components (e.g., the sensor module 176, the camera module 180, or the antenna module 197) may be integrated as a single component (e.g., the display module 160).

The processor 120 may execute software (e.g., a program 140) to control at least one other component (e.g., a hardware or software component) of the electronic device 101 connected to the processor 120 and may perform various data processing or computations, for example. In an embodiment, as at least a part of data processing or computations, the processor 120 may store a command or data received from another component (e.g., the sensor module 176 or the communication module 190) in a volatile memory 132, process the command or the data stored in the volatile memory 132, and store resulting data in a non-volatile memory 134. In an embodiment, the processor 120 may include a main processor 121 (e.g., a central processing unit ("CPU") or an application processor ("AP")), or an auxiliary processor 123 (e.g., a graphics processing unit ("GPU"), a neural processing unit ("NPU"), an image signal processor ("ISP"), a sensor hub processor, or a communication processor ("CP")) that is operable independently from or in conjunction with the main processor 121. In an embodiment, when the electronic device 101 includes the main processor 121 and the auxiliary processor 123, the auxiliary processor 123 may be adapted to consume less power than power of the main processor 121 or to be specific to a specified function, for example. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). In an embodiment, the auxiliary processor 123 (e.g., an ISP or a CP) may be implemented as a portion of another component (e.g., the camera module 180 or the communication module 190) that is functionally related to the auxiliary processor 123. In an embodiment, the auxiliary processor 123 (e.g., an NPU) may include a hardware structure specifically for artificial intelligence model processing. An artificial intelligence model may be generated by machine learning. The machine learning may be performed by the electronic device 101, in which artificial intelligence is performed, or performed via a separate server (e.g., the server 108), for example. Learning algorithms may include, but are not limited to supervised learning, unsupervised learning, semi-supervised learning, or reinforcement learning, for example. The artificial intelligence ("AI") model may include a plurality of artificial neural network layers. An artificial neural network may include a deep neural network ("DNN"), a convolutional neural network ("CNN"), a recurrent neural network ("RNN"), a restricted Boltzmann machine ("RBM"), a deep belief network ("DBN"), and a bidirectional recurrent deep neural network ("BRDNN"), a deep Q-network ("DQN"), or a combination of two or more thereof, for example, but is not limited thereto. The AI model may additionally or alternatively include a software structure other than the hardware structure.

The memory 130 may store various pieces of data used by at least one component (e.g., the processor 120 or the sensor module 176) of the electronic device 101. The various pieces of data may include software (e.g., the program 140) and input data or output data for a command related thereto, for example. The memory 130 may include the volatile memory 132 or the non-volatile memory 134.

The program 140 may be stored as software in the memory 130 and may include an operating system ("OS") 142, middleware 144, or an application 146, for example.

The input module 150 may receive, from outside (e.g., a user) the electronic device 101, a command or data to be used by another component (e.g., the processor 120) of the electronic device 101. The input module 150 may include a microphone, a mouse, a keyboard, a key (e.g., a button), or a digital pen (e.g., a stylus pen), for example.

The sound output module 155 may output a sound signal to the outside of the electronic device 101. The sound output module 155 may include a speaker or a receiver, for example. The speaker may be used for general purposes, such as playing multimedia or playing a recording. The receiver may be used to receive an incoming call. In an embodiment, the receiver may be implemented separately from the speaker or as a part of the speaker.

The display module 160 may visually provide information to the outside (e.g., a user) of the electronic device 101. The display module 160 may include a control circuit for controlling a display, a hologram device, or a projector and control circuitry to control its corresponding one of the display, the hologram device, and the projector, for example. In an embodiment, the display module 160 may include a touch sensor adapted to detect a touch, or a pressure sensor adapted to measure the intensity of force of the touch.

The audio module 170 may convert sound into an electric signal or vice versa. In an embodiment, the audio module 170 may obtain the sound via the input module 150 or output the sound via the sound output module 155 or an external electronic device (e.g., the electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. In an embodiment, the sensor module 176 may include a gesture sensor, a gyro sensor, an atmospheric pressure sensor, a magnetic sensor, an acceleration sensor, a grip sensor, a proximity sensor, a color sensor, an infrared ("IR") sensor, a biometric sensor, a temperature sensor, a humidity sensor, or an illuminance sensor, for example.

The interface 177 may support one or more specified protocols to be used by the electronic device 101 to couple with the external electronic device (e.g., the electronic device 102) directly (e.g., by wire) or wirelessly. In an embodiment, the interface 177 may include a high-definition multimedia interface ("HDMI"), a universal serial bus ("USB") interface, a secure digital ("SD") card interface, or an audio interface, for example.

The connecting terminal 178 may include a connector via which the electronic device 101 may be physically connected to an external electronic device (e.g., the electronic device 102). In an embodiment, the connecting terminal 178 may include an HDMI connector, a USB connector, an SD card connector, or an audio connector (e.g., a headphones connector), for example.

The haptic module 179 may convert an electric signal into a mechanical stimulus (e.g., a vibration or a movement) or an electrical stimulus, which may be recognized by a user via tactile sensation or kinesthetic sensation of the user. In an embodiment, the haptic module 179 may include a motor, a piezoelectric element, or an electric stimulator, for example.

The camera module 180 may capture a still image and moving images. In an embodiment, the camera module 180 may include one or more lenses, image sensors, ISPs, and flashes.

The power management module 188 may manage power supplied to the electronic device 101. In an embodiment, the power management module 188 may be implemented as at least a part of a power management integrated circuit ("PMIC"), for example.

The battery 189 may supply power to at least one component of the electronic device 101. In an embodiment, the battery 189 may include a primary cell, which is not rechargeable, a secondary cell, which is rechargeable, or a fuel cell, for example.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. In an embodiment, the communication module 190 may include a wireless communication module 192 (e.g., a cellular communication module, a short-range wireless communication module, or a global navigation satellite system ("GNSS") communication module) or a wired communication module 194 (e.g., a local area network ("LAN") communication module, or a power line communication ("PLC") module). A corresponding one of these communication modules may communicate with the external electronic device, e.g., the electronic device 104, via the first network 198 (e.g., a short-range communication network, such as Bluetooth™, wireless-fidelity ("Wi-Fi") direct, or IR data association ("IrDA")) or the second network 199 (e.g., a long-range communication network, such as a legacy cellular network, a 5G network, a next-generation communication network, the Internet, or a computer network (e.g., a LAN or a wide area network ("WAN"))). These various types of communication modules may be implemented as a single component (e.g., a single chip), or may be implemented as multiple components (e.g., multiple chips) separated from each other. The wireless communication module 192 may identify and authenticate the electronic device 101 in a communication network, such as the first network 198 or the second network 199, using subscriber information (e.g., international mobile subscriber identity ("IMSI")) stored in the SIM 196.

The wireless communication module 192 may support a 5G network after a 4G network, and next-generation communication technology, e.g., new radio ("NR") access technology. The NR access technology may support enhanced mobile broadband ("eMBB"), massive machine type communications ("mMTC"), or ultra-reliable and low-latency communications ("URLLC"). The wireless communication module 192 may support a high-frequency band (e.g., a mmWave band) to achieve a high data transmission rate, for example. The wireless communication module 192 may support various technologies for securing performance on a high-frequency band, such as beamforming, massive multiple-input and multiple-output ("MIMO"), full dimensional MIMO ("FD-MIMO"), an array antenna, analog beamforming, or a large-scale antenna. The wireless communication module 192 may support various requirements specified in the electronic device 101, an external electronic device (e.g., the electronic device 104), or a network system (e.g., the second network 199). In an embodiment, the wireless communication module 192 may support a peak data rate (e.g., 20 gigabits per second (Gbps) or more) for implementing eMBB, loss coverage (e.g., 164 decibels (dB) or less) for implementing mMTC, or U-plane latency (e.g., 0.5 millisecond (ms) or less for each of downlink ("DL") and uplink ("UL"), or a round trip of 1 ms or less) for implementing URLLC.

The antenna module 197 may transmit or receive a signal or power to or from the outside (e.g., the external electronic device) of the electronic device 101. In an embodiment, the antenna module 197 may include an antenna including a radiating element including a conductive material or a conductive pattern formed or provided in or on a substrate (e.g., a printed circuit board ("PCB")). In an embodiment, the antenna module 197 may include a plurality of antennas (e.g., an antenna array). In such a case, at least one antenna appropriate for a communication scheme used in a communication network, such as the first network 198 or the second network 199, may be selected by the communication module 190 from the plurality of antennas, for example. The signal or power may be transmitted or received between the communication module 190 and the external electronic device via the at least one selected antenna. In an embodiment, another component (e.g., a radio frequency integrated circuit ("RFIC")) other than the radiating element may be additionally formed or provided as a part of the antenna module 197.

In various embodiments, the antenna module 197 may form a mmWave antenna module. In an embodiment, the mmWave antenna module may include a PCB, an RFIC on a first surface (e.g., the bottom surface) of the PCB, or adjacent to the first surface of the PCB and capable of supporting a designated high-frequency band (e.g., a mmWave band), and a plurality of antennas (e.g., array antennas) disposed on a second surface (e.g., the top or a side surface) of the PCB, or adjacent to the second surface of the PCB and capable of transmitting or receiving signals of the designated high-frequency band.

At least some of the above-described components may be coupled mutually and exchange signals (e.g., commands or data) therebetween via an inter-peripheral communication scheme (e.g., a bus, general purpose input and output ("GPIO"), serial peripheral interface ("SPI"), or mobile industry processor interface ("MIPI")).

In an embodiment, commands or data may be transmitted or received between the electronic device 101 and the external electronic device (e.g., the electronic device 104) via the server 108 coupled with the second network 199. Each of the external electronic devices (e.g., the electronic device 102 or 104) may be a device of the same type as or a different type from the electronic device 101. In an embodiment, all or some of operations to be executed by the electronic device 101 may be executed by one or more external electronic devices (e.g., the electronic devices 102 and 104 and the server 108). In an embodiment, when the electronic device 101 is desired to perform a function or a service automatically, or in response to a request from a user or another device, the electronic device 101, instead of, or in addition to, executing the function or the service, may request the one or more external electronic devices to perform at least part of the function or service, for example. The one or more external electronic devices receiving the request may perform the at least part of the function or service, or an additional function or an additional service related to the request, and may transfer a result of the performance to the electronic device 101. The electronic device 101 may provide the result, with or without further processing the result, as at least part of a response to the request. To that end, cloud computing, distributed computing, mobile edge computing ("MEC"), or client-server computing technology may be used, for example. The electronic device 101 may provide ultra-low-latency services using distributed computing or MEC, for example. In an embodiment, the external electronic device (e.g., the electronic device 104) may include an Internet-of-things ("IoT") device. The server 108 may be an intelligent server using machine learning and/or a neural network. In an embodiment, the external electronic device (e.g., the electronic device 104) or the server 108 may be included in the second network 199. The electronic device 101 may be applied to intelligent services (e.g., a smart home, a smart city, a smart car, or healthcare) based on 5G communication technology or IoT-related technology.

The electronic device in various embodiments may be one of various types of electronic devices. The electronic device may include a portable communication device (e.g., a smartphone), a computer device, a portable multimedia device, a portable medical device, a camera, a wearable device, or a home appliance device, for example. In an embodiment of the disclosure, the electronic device is not limited to those described above.

It should be understood that various embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other features (e.g., importance or order). It is to be understood that when an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with various embodiments of the disclosure, the term "module" may include a unit implemented in hardware, software, or firmware, and may interchangeably be used with other terms, e.g., "logic," "logic block," "part," or "circuitry". A module may be a single integral component, or a minimum unit or part thereof, adapted to perform one or more functions. In an embodiment, the module may be implemented in a form of an application-specific integrated circuit ("ASIC"), for example.

Various embodiments as set forth herein may be implemented as software (e.g., the program 140) including one or more instructions that are stored in a storage medium (e.g., the internal memory 136 or the external memory 138) that is readable by a machine (e.g., the electronic device 101). In an embodiment, a processor (e.g., the processor 120) of the machine (e.g., the electronic device 101) may invoke at least one of the one or more instructions stored in the storage medium and execute the at least one of the one or more instructions, for example. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

In an embodiment, a method in various embodiments of the disclosure may be included and provided in a computer program product. The computer program product may be traded as a product between a seller and a buyer. The computer program product may be distributed in the form of a machine-readable storage medium (e.g., a compact disc read-only memory ("CD-ROM")), or be distributed (e.g., downloaded or uploaded) online via an application store (e.g., PlayStore™), or between two user devices (e.g., smartphones) directly. When distributed online, at least part of the computer program product may be temporarily generated or at least temporarily stored in the machine-readable storage medium, such as a memory of the manufacturer's server, a server of the application store, or a relay server.

In various embodiments, each component (e.g., a module or a program) of the above-described components may include a single entity or multiple entities, and some of the multiple entities may be separately disposed in different components. In various embodiments, one or more of the above-described components may be omitted, or one or more other components may be added. Alternatively or additionally, a plurality of components (e.g., modules or programs) may be integrated into a single component. In such a case, in various embodiments, the integrated component may still perform one or more functions of each of the plurality of components in the same or similar manner as the one or more functions are performed by a corresponding one of the plurality of components before the integration. In various embodiments, operations performed by the module, the program, or another component may be carried out sequentially, in parallel, repeatedly, or heuristically, or one or more of the operations may be executed in a different order or omitted, or one or more other operations may be added.

Figure 2A:
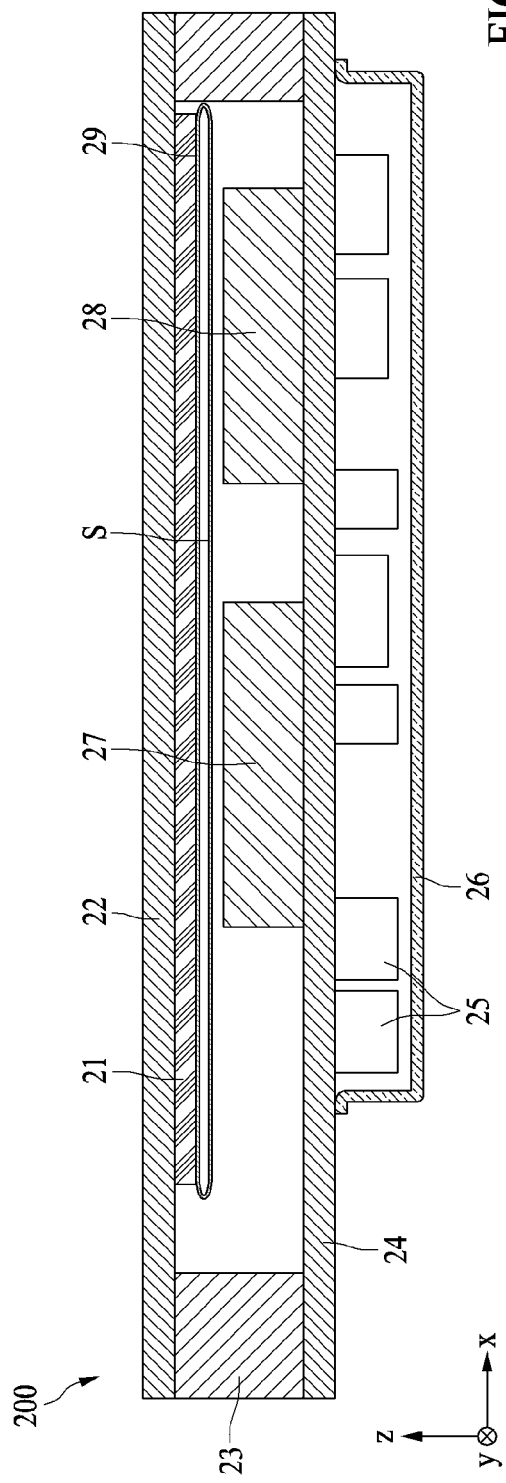
FIG. 2A is a cross-sectional view illustrating an embodiment of an electronic device with a thermal interface material ("TIM") not being injected inside an accommodation part.
Figure 2B:
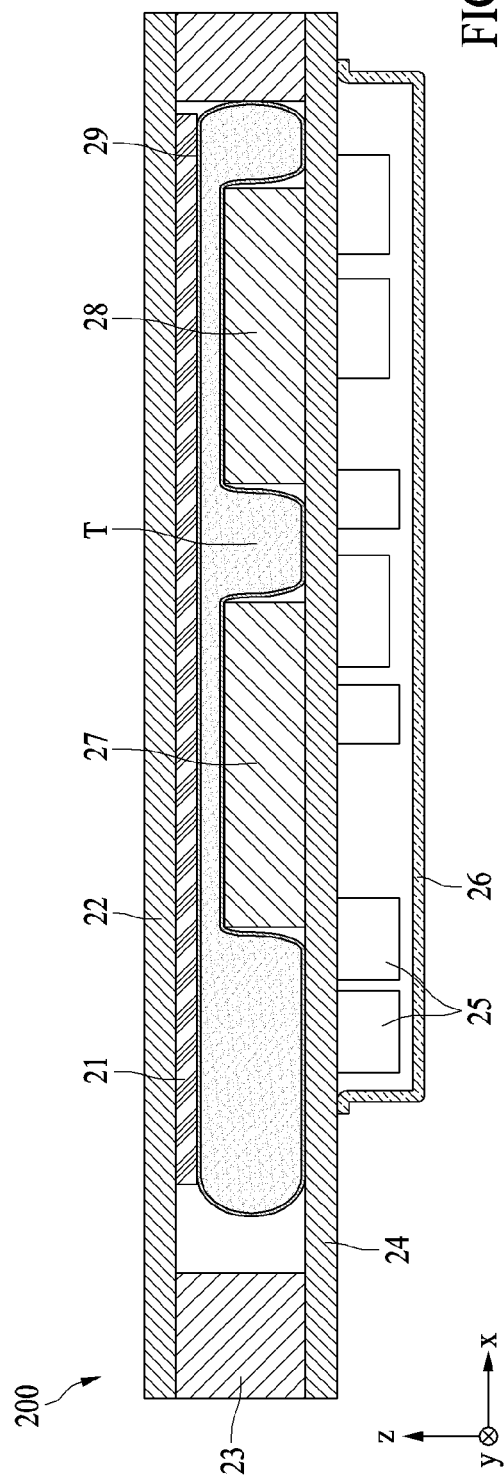
FIG. 2B is a cross-sectional view illustrating an embodiment of the electronic device with a TIM being injected inside the accommodation part.
Figure 2C:
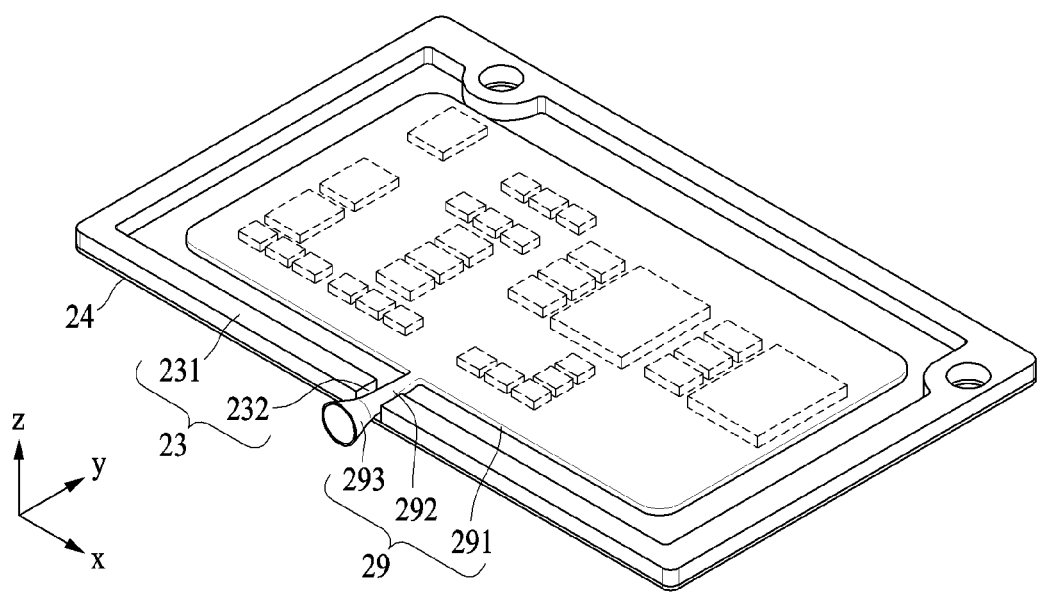
FIG. 2C is a perspective view illustrating an embodiment of the electronic device without a cover plate and a heat conduction plate.
Figure 2D:
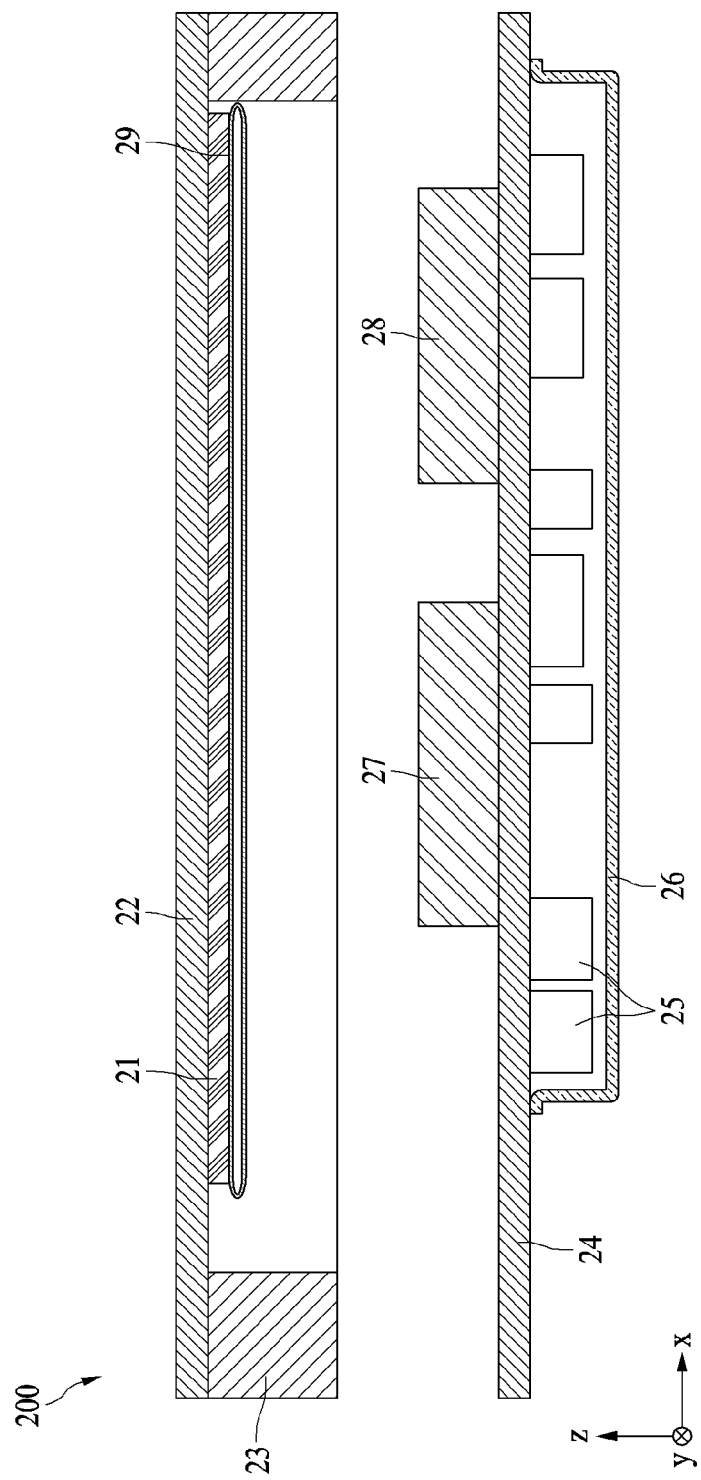
FIG. 2D is an exploded view illustrating an embodiment of the electronic device with the cover plate spaced apart from an interposer.

FIG. 2A is a cross-sectional view illustrating an embodiment of an electronic device with a thermal interface material ("TIM") not injected inside an accommodation part (e.g., pocket). FIG. 2B is a cross-sectional view illustrating an embodiment of the electronic device with a TIM injected inside the accommodation part (e.g., pocket). FIG. 2C is a perspective view illustrating an embodiment of the electronic device without a cover plate and a heat conduction plate. FIG. 2D is an exploded view illustrating an embodiment of the electronic device with the cover plate spaced apart from an interposer.

Referring to FIGS. 2A to 2D, the electronic device (e.g., the electronic device 101 of FIG. 1) may include a PCB structure 200. The PCB structure 200 may include a TIM T inside the PCB structure 200. The TIM T may not be directly injected inside the PCB structure 200 and may be injected inside an accommodation part (e.g., pocket 29) in the PCB structure 200. The PCB structure 200 may include a plurality of components. The PCB structure 200 may include a third component 25 on a first surface (e.g., lower surface in FIG. 2A) of a base plate 24, a first component 27 on a second surface (e.g., upper surface in FIG. 2A) of the base plate 24, and/or a second component 28 on the second surface of the base plate 24. In an embodiment, the first surface of the base plate 24 may face a cover plate 22 and the second surface of the base plate 24 may face the opposite direction of the first surface of the base plate 24, for example. Any component of the plurality of components may be at a relatively high temperature. Among the plurality of components, a component inside the PCB structure 200, operating at a relatively high temperature, and emitting heat around the component may be hereinafter referred to as a "first component". A component inside the electronic device and operating at a relatively low temperature compared to the "first component" may be hereinafter referred to as a "second component". A component on a second surface of the PCB structure 200 may be hereinafter referred to as a "third component".

In an embodiment, the third component 25, the first component 27, and/or the second component 28 may be one of a processor (e.g., the processor 120 of FIG. 1), a memory (e.g., the memory 130 of FIG. 1), an input module (e.g., the input module 150 of FIG. 1), a sound output module (e.g., the sound output module 155 of FIG. 1), a display module (e.g., the display module 160 of FIG. 1), an audio module (e.g., the audio module 170 of FIG. 1), a sensor module (e.g., the sensor module 176 of FIG. 1), an interface (e.g., the interface 177 of FIG. 1), a connecting terminal (e.g., the connecting terminal 178 of FIG. 1), a haptic module (e.g., the haptic module 179 of FIG. 1), a camera module (e.g., the camera module 180 of FIG. 1), a power management module (e.g., the power management module 188 of FIG. 1), and a battery (e.g., the battery 189 of FIG. 1).

In an embodiment, the first component 27 may be a component of which the temperature is relatively higher than a temperature of any other components inside the PCB structure 200. In an embodiment, the first component 27 may include an AP, for example. Although only one second component (e.g., the second component 28) is illustrated inside the PCB structure 200 in the drawings, the number of second components 28 may not be limited thereto.

In an embodiment, the PCB structure 200 may include a heat conduction plate 21, the cover plate 22, an interposer 23, the base plate 24, and/or a cover 26.

The base plate 24 may include a plurality of components (e.g., the third component 25, the first component 27, and the second component 28) on the base plate 24. One surface of the base plate 24 may be on the third component 25, and the other surface of the base plate 24 may be on the first component 27 and/or the second component 28. The first component 27 may have a relatively higher temperature than a temperature of the second component 28. The base plate 24 may have a plate shape. In an embodiment, the base plate 24 may include a PCB including a plurality of conductive layers and insulating layers, for example. Although the base plate 24 is illustrated as having a flat plate shape in the drawings, the disclosure is not limited thereto. In an embodiment, the base plate 24 may include a curved surface, for example. In another embodiment, the base plate 24 may have at least one bent shape.

In one embodiment, the interposer 23 may be on the base plate 24. In an embodiment, the interposer 23 may be electrically connected to the base plate 24, for example. In another embodiment, the interposer 23 may be unitary with the base plate 24 as one body. In one embodiment, the interposer 23 may have a loop shape forming a closed curve.

At least a portion of the interposer 23 may surround the first component 27 and the second component 28. The interposer 23 may include an interposer body 231 and an inlet 232, for example.

In one embodiment, the interposer 23 may be on the cover plate 22. In an embodiment, the interposer 23 may be unitary with the cover plate 22 as one body, for example. In one embodiment, the interposer 23 may be on the edge of the cover plate 22 and surround the pocket 29. In this structure, the interposer 23 may protect the pocket 29 from external impact before attaching to the base plate 24.

In one embodiment, the interposer 23 may electrically connect the base plate 24 to the cover plate 22 such that the base plate 24 and the cover plate 22 may transmit and receive signals to and from each other. The interposer 23 may shield from electromagnetic waves. The interposer 23 may include a PCB having at least two layers and include a plurality of signal lines and ground lines. In an embodiment, one side of the interposer 23 may include a plated part for shielding from the electromagnetic waves, for example.

In one embodiment, the interposer body 231 may approximately have a ring shape. The height of the interposer 231 may be greater than the heights of the first component 27 and the second component 28, for example. The cover plate 22, when being on the interposer body 231, may be spaced apart from the first component 27 and the second component 28.

In one embodiment, the inlet 232 may be disposed in the interposer body 231. A space defined by the cover plate 22, the base plate 24, and the interposer body 231 may be extended to the outside by the inlet 232. Through the inlet 232, the TIM T may be injected inside the PCB structure 200. In an embodiment, the TIM T may be injected inside the pocket 29 in a direction parallel to an x-y plane, for example. The TIM T injected inside the pocket 29 may be spread out on the x-y plane. Since a direction in which the TIM T is injected may approximately be parallel to the x-y plane on which the TIM T spreads out, the TIM T may be easily injected inside the pocket 29.

In one embodiment, the interposer body 231 may be separated into two sides around the inlet 232. In an embodiment, the base plate 24 and the cover plate 22 may face each other around the inlet 232, for example.

In one embodiment, the cover plate 22 may be electrically connected to the interposer 23. In an embodiment, the cover plate 22 may be on the interposer 23. In another embodiment, the cover plate 22 may be unitary with the interposer 23 as one body, for example. The base plate 24, the interposer 23, and the cover plate 22 may define a space. The cover plate 22 may include a PCB including a plurality of conductive layers and insulating layers.

In one embodiment, the heat conduction plate 21 may absorb some of the heat emitted from the first component 27. The heat conduction plate 21 may be on the cover plate 22. In an embodiment, the heat conduction plate 21 may face the first component 27 and the second component 28, for example. At least a portion of the heat conduction plate 21 may contact the pocket 29.

In one embodiment, the cover 26 may include a shield can.

In one embodiment, the TIM T may be filled in the pocket 29. The TIM T may include mineral oil, grease, gap filling putty, phase change gel, phase change material pads, or particle filling epoxy, for example. However, the disclosure is not limited to the foregoing examples, and the TIM T may include various materials having excellent heat conductivity.

In one embodiment, the TIM T may be provided in a solid state by being hardened inside the pocket 29. The TIM T may be spaced apart, by the pocket 29, from the base plate 24 and the cover plate 22. The TIM T may surround at least a portion of the first component 27. In an embodiment, the pocket 29 may cover at least a portion of a surface of the first component 27, not in contact with the base plate 24, for example. The TIM T may be provided in a solid state by being hardened inside the pocket 29, for example.

In one embodiment, the TIM T may be provided in an unhardened state and inside the pocket 29.

In one embodiment, the pocket 29 may accommodate the TIM T. The pocket 29 may prevent the TIM T from directly contacting the base plate 24, the heat conduction plate 21, the first component 27, and the second component 28. In one embodiment, the pocket 29 may have a porous structure in which air inside may escape to the outside. Since the pocket 29 has a porous structure, the TIM T may be more efficiently filled inside the pocket 29. The size of a micro hole defined in the porous structure may be smaller than a particle size of a liquid TIM T. In an embodiment, while the TIM T is injected inside the pocket 29, air inside the pocket 29 may leak to the outside through the porous structure, for example. The air may be discharged to the outside through the inlet 232. In one embodiment, the accommodation part (e.g., pocket 29) may include an accommodation body (e.g., pocket body 291) or an accommodation head (e.g., pocket head 292). In an embodiment, an accommodation opening (e.g., pocket opening 293) may be defined in the accommodation part (e.g., pocket 29).

The pocket body 291 may be accommodated inside the interposer body 231 and an accommodation space S for accommodating the TIM T may be defined in the pocket body 291.

The pocket head 292 may extend from the pocket body 291 and be in the inlet 232.

The pocket opening 293 may extend from the pocket head 292 and have a shape of which the width increases in a direction away from the pocket body 291. In this structure, a user or an automated device (e.g., robot with a sensor) may easily insert a nozzle (not shown) into the pocket 29.

Assembling the PCB structure 200 and filling the TIM T inside the PCB structure 200 are described hereinafter.

The pocket 29 may be in a space defined by the cover plate 22, the base plate 24, and the interposer 23. In an embodiment, the pocket 29 may be in a space defined by the base plate 24 and the interposer 23, and the cover plate 22 may be connected to the interposer 23 in the −z direction, for example. The pocket head 292 of the pocket 29 may be included in the inlet 232 (refer to FIG. 2C) with the cover plate 22 connected to the interposer 23. In this case, the pocket 29 may maintain a flat shape.

After the cover plate 22, the base plate 24, and the interposer 23 are soldered to one another, the TIM T may be injected into the pocket 29. In an embodiment, the TIM T may be injected into the pocket 29 after soldering the cover plate 22, the base plate 24, and the interposer 23 to one another, which may prevent the pocket 29 from expanding before soldering the cover plate 22, the base plate 24, and the interposer 23 to one another, for example. By doing so, a defect in a solder joint may be caused less by the pocket 29.

The nozzle (not shown) may be fastened on the pocket opening 293. The TIM T discharged from the nozzle fastened to the pocket 29 may fill the pocket body 291. While the TIM T is filled in the pocket body 291, the pocket 29 may gradually inflate. In an embodiment, at least a portion of the pocket 29 may expand to a space between the first component 27 and the second component 28, for example. The pocket 29 may expand until at least a portion of the first component 27 and the second component 28 are surrounded. In an embodiment, at least a portion of the pocket 29 may contact the base plate 24, for example.

Of the first component 27, a surface facing the −z direction may contact the base plate 24, and the remaining surfaces may be covered by the pocket 29. The TIM T may absorb heat emitted from the first component 27.

In one embodiment, the first component 27 and the second component 28 may need to be maintained, repaired, and/or replaced. In this case, a user, by removing the pocket 29 after removing the cover plate 22, may easily maintain, repair, and replace the first component 27 and/or the second component 28.

Figure 3A:
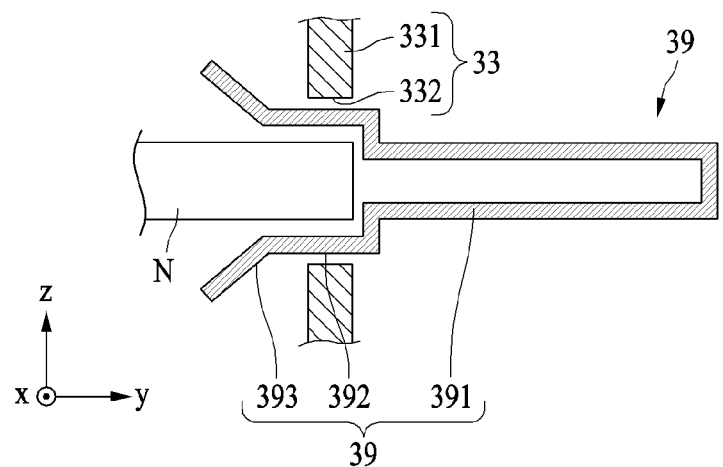
FIG. 3A is a schematic diagram illustrating an embodiment of an accommodation part with a nozzle inserted into an accommodation head.
Figure 3B:
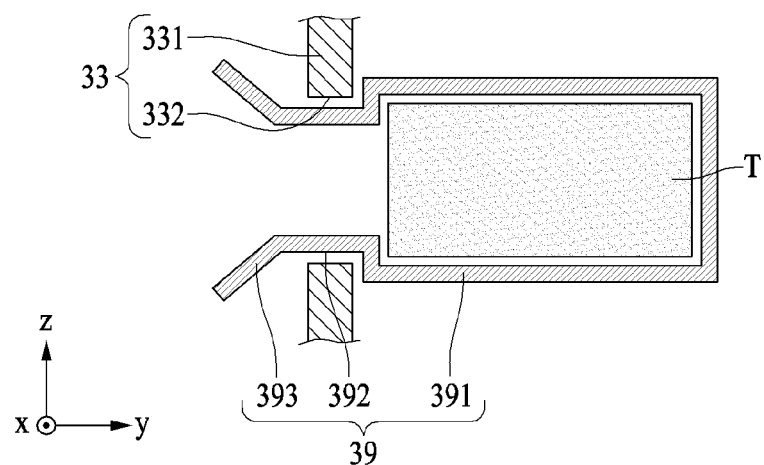
FIG. 3B is a schematic diagram illustrating an embodiment of the accommodation part with a TIM injected inside an accommodation body.
Figure 3C:
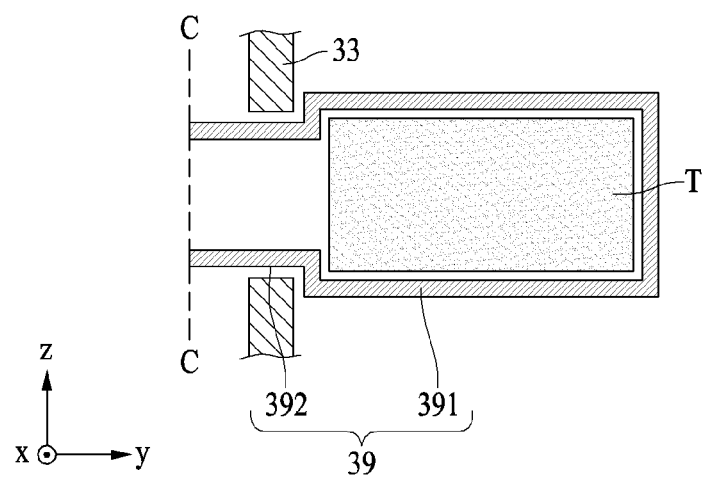
FIG. 3C is a schematic diagram illustrating an embodiment of the accommodation part without an accommodation opening.
Figure 3D:
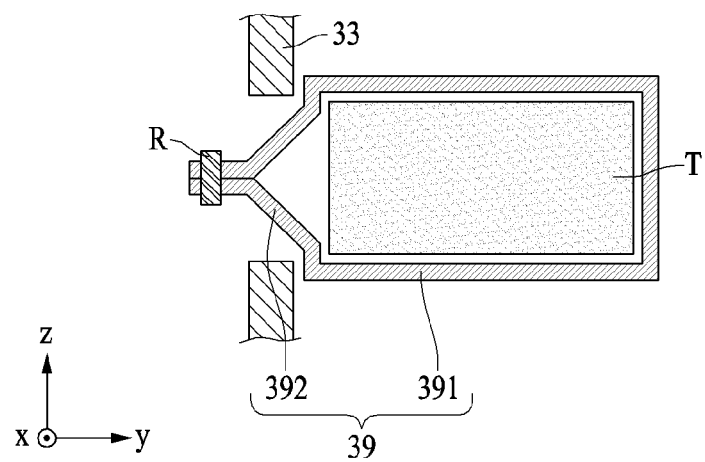
FIG. 3D is a schematic diagram illustrating an embodiment of the accommodation part with an accommodation head closed by a sealing.

FIG. 3A is a schematic diagram illustrating an embodiment of a pocket with a nozzle inserted into a pocket head. FIG. 3B is a schematic diagram illustrating an embodiment of the pocket with a TIM injected inside a pocket body. FIG. 3C is a schematic diagram illustrating an embodiment of the pocket without a pocket opening. FIG. 3D is a schematic diagram illustrating an embodiment of a pocket with a pocket head closed by a sealing member.

Referring to FIGS. 3A to 3D, a pocket 39 (e.g., the pocket 29) may include a pocket body 391, a pocket head 392 extending from the pocket body 391, a pocket opening 393 extending from the pocket head 392, or a sealing member R coupled to the pocket head 392.

The pocket body 391 may accommodate a TIM T.

The pocket head 392 may extend from the pocket body 391 and pass through an interposer 33. The interposer 33 may include an interposer body 331 and an inlet 332 disposed in one side of the interposer body 331. The pocket head 392 may be in the inlet 332.

The pocket opening 393 may have a shape of which the width increases in a direction away from the pocket body 391. A nozzle N may be inserted through the pocket opening 393.

The sealing member R may close an inner space of the pocket body 391. In an embodiment, when the TIM T is sufficiently injected into the pocket body 391, the pocket opening 393 may be removed, for example. When the pocket opening 393 has been removed, a user or an automated device (e.g., robot with a sensor) may seal the pocket head 392 with the sealing member R. A cap (not shown) for closing the inlet 332 may be on the inlet 332.

Figure 4:
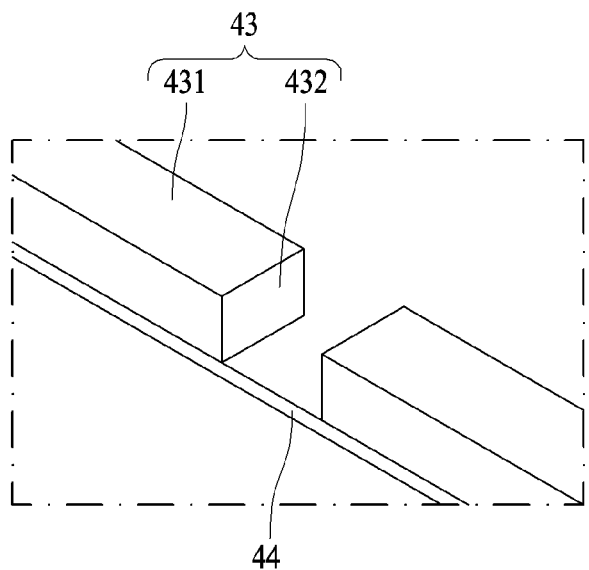
FIG. 4 is a magnified perspective view of an embodiment of an interposer.

FIG. 4 is a magnified perspective view of an embodiment of an interposer.

Referring to FIG. 4, an interposer 43 (e.g., the interposer 23 of FIG. 2A) may be on a base plate 44 (e.g., the base plate 24 of FIG. 2A). The interposer 43 may include an interposer body 431 (e.g., the interposer body 231 of FIG. 2C) or an inlet 432 (e.g., the inlet 232 of FIG. 2C) disposed in the interposer body 431. The base plate 44 may be exposed around the inlet 432. In this structure, because the area of the inlet 432 may be substantially large, a TIM T having relatively large particles may be easily used.

Figure 5:
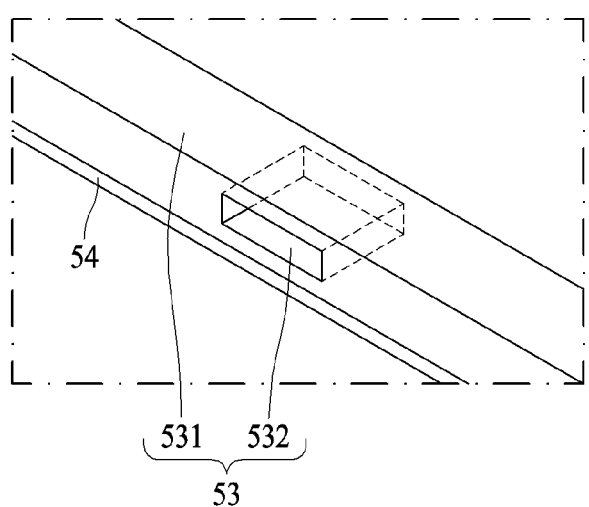
FIG. 5 is another magnified perspective view of an embodiment of an interposer.

FIG. 5 is another magnified perspective view of an embodiment of an interposer.

Referring to FIG. 5, an interposer 53 may be on a base plate 54. The interposer 53 may include an interposer body 531 or an inlet 532 disposed through the interposer body 531. In this structure, a user or an automated device (e.g., robot with a sensor), after injecting a TIM T inside a pocket (not shown) (e.g., the pocket 29), may easily close the inlet 532.

Figure 6:
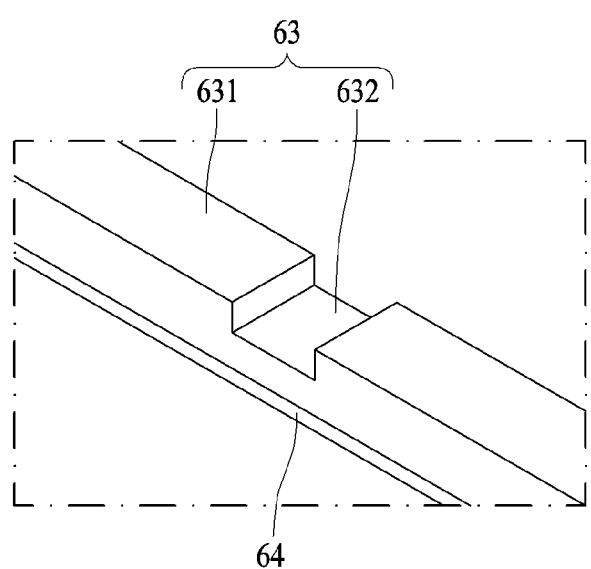
FIG. 6 is yet another magnified perspective view of an embodiment of an interposer.

FIG. 6 is yet another magnified perspective view of an embodiment of an interposer.

Referring to FIG. 6, an interposer 63 may be on a base plate 64. The interposer 63 may include an interposer body 631 or an inlet 632 disposed through the interposer body 631. The inlet 632 may have a shape recessed from a surface, of the interposer body 631, facing a cover plate (not shown). In this structure, a user or an automated device (e.g., robot with a sensor), after interposer body 631 is on the base plate 64, may form the inlet 632 later, when desired.

By embodiments, an electronic device includes a PCB structure accommodating a TIM, in which the PCB structure includes a base plate 24, a first component 27 on the base plate 24, a second component 28 on the base plate 24 and spaced apart from the first component 27, an interposer 23 connected to the base plate 24 and surrounding the first component 27 and the second component 28, a cover plate 22 connected to the interposer 23 and covering the first component 27 and the second component 28, and a pocket 29 which is between the base plate 24 and a heat conduction plate 21 and accommodates the TIM.

The PCB structure may further include a TIM T accommodated in the pocket 29.

The TIM T may be spaced apart from the base plate 24 and the cover plate 22 by the pocket 29.

With the TIM T in the pocket 29, the pocket 29 may contact the base plate 24.

The TIM T may be provided in a solid state by being hardened inside the pocket 29.

The PCB structure may be on the cover plate 22 and may further include a heat conduction plate 21 facing the first component 27 and the second component 28.

The pocket 29 may attach to the heat conduction plate 21.

The interposer 23 may include an interposer body 231 and an inlet 232 disposed in the interposer body 231. The interposer body 231 surrounds the first component 27 and the second component 28, and the inlet 232 accommodates at least a portion of the pocket 29.

The pocket 29 may include a pocket body 291 and a pocket head 292 extending from the pocket body 291 and inside the inlet 232. The pocket body 291 may be accommodated inside the interposer body 231 and an accommodation space S (refer to FIG. 2A) for accommodating the TIM T may be defined in the pocket body 291.

The pocket 29 may further include a pocket opening 293 extending from the pocket head 292 and having a shape of which the width increases in a direction away from the pocket body 291.

The pocket 29 may further include a sealing member R coupled to the pocket head 292.

The inlet 232 may be disposed through the interposer body 231 and having a shape surrounded by the interposer body 231.

The inlet 232 may have a shape recessed from a surface, of the interposer body 231, facing the cover plate 22.

The pocket 29 may have a porous structure in which air inside the pocket 29 may escape to the outside.

At least a portion of the pocket 29 may be between the first component 27 and the second component 28.

By embodiments, an electronic device includes a PCB structure accommodating a TIM, in which the PCB structure includes a base plate 24, a first component 27 on the base plate 24, a second component 28 on the base plate 24 and spaced apart from the first component 27, an interposer 23 connected to the base plate 24 and surrounding the first component 27 and the second component 28, a cover plate 22 connected to the interposer 23 and covering the first component 27 and the second component 28, a heat conduction plate 21 on the cover plate 22 and facing the first component 27 and the second component 28, a pocket 29 which is between the base plate 24 and the heat conduction plate 21 and accommodates the TIM, and a TIM T provided in a solid state by being hardened in the pocket 29.

The TIM T may be spaced apart from the base plate 24 and the cover plate 22 by the pocket 29.

The pocket 29 may be provided with one side of the pocket 29 attached to the heat conduction plate 21 and the other side of the pocket 29 contacting the base plate 24.

At least a portion of the pocket 29 may be between the first component 27 and the second component 28.

By embodiments, an electronic device includes a PCB structure, in which the PCB structure includes a base plate 24, a first component 27 on the base plate 24, a second component 28 on the base plate 24 and spaced apart from the first component 27, an interposer 23 including an interposer body 231 and an inlet 232 through which an inner space of the interposer body 231 meets the outside, in which the interposer 23 is connected to the base plate 24 and surrounds the first component 27 and the second component 28, a cover plate 22 connected to the interposer 23 and covering the first component 27 and the second component 28, a heat conduction plate 21 on the cover plate 22 and facing the first component 27 and the second component 28, a pocket 29 including a pocket body 291 and a pocket head 292 extending from the pocket body 291, in which the pocket body 291 is between the base plate 24 and the heat conduction plate 21, and pocket head 292 is inside the inlet 232, and a TIM T accommodated in the pocket 29 and provided in a solid state by being hardened in the pocket 29.

What is claimed is:

1. An electronic device comprising:
   a printed circuit board structure comprising:
     a base plate;
     a cover plate;
     an interposer connected to the base plate and the cover plate and surrounding a space between the base plate and the cover plate, the interposer comprising:
       an interposer body;
       an inlet disposed in the interposer body;
     a first component on the base plate and in the space; and
     an accommodation part which is in the space and accommodates a thermal interface material, the accommodation part comprising:
       an accommodation body accommodated in the space and including an accommodation space for accommodating the thermal interface material, and
       an accommodation head extending from the accommodation body and included inside the inlet,
     wherein
     the interposer body surrounds the first component, and
     the inlet accommodates at least a portion of the accommodation part.

2. The electronic device of claim 1, wherein
   the thermal interface material includes at least one of mineral oil, grease, gap filling putty, phase change gel, phase change material pads, or particle filling epoxy.

3. The electronic device of claim 2, wherein
   the thermal interface material is spaced apart from the base plate and the cover plate by the accommodation part.

4. The electronic device of claim 2, wherein,
   with the thermal interface material in the accommodation part, the accommodation part contacts the base plate.

5. The electronic device of claim 2, wherein
   the thermal interface material is provided in a solid state by being hardened in the accommodation part.

6. The electronic device of claim 1, wherein
   the printed circuit board structure further comprises:
     a heat conduction plate on the cover plate and facing the first component.

7. The electronic device of claim 6, wherein
   the accommodation part is attached to the heat conduction plate.

8. The electronic device of claim 1, wherein
   an accommodation opening extending from the accommodation head and having a shape of which a width increases in a direction away from the accommodation body is defined in the accommodation part.

9. The electronic device of claim 1, wherein
   the accommodation part further comprises:
     a sealing member coupled to the accommodation head.

10. The electronic device of claim 1, wherein
    the inlet is disposed through the interposer body and having a shape surrounded by the interposer body.

11. The electronic device of claim 1, wherein
    the inlet has a shape recessed from a surface, of the interposer body, facing the cover plate.

12. The electronic device of claim 1, wherein
    the accommodation part has a porous structure in which air inside the accommodation part escapes to the outside.

13. The electronic device of claim 1, wherein
    the printed circuit board structure further comprises:
      a second component in the space, and
    at least a portion of the accommodation part is between the first component and the second component.

14. An electronic device comprising:
    a printed circuit board structure comprising:
      a base plate;
      a cover plate;
      an interposer connected to the base plate and the cover plate and surrounding a space between the base plate and the cover plate, the interposer comprising:
        an interposer body; and
        an inlet disposed in the interposer body;
      a first component on the base plate and in the space;
      a heat conduction plate on the cover plate and facing the first component; and
      an accommodation part which is between the base plate and the heat conduction plate, the accommodation part comprising:
        an accommodation body accommodated in the space and including an accommodation space for accommodating
      a thermal interface material provided in a solid state by being hardened in the accommodation part; and
        an accommodation head extending from the accommodation body and included inside the inlet,
      wherein
      the interposer body surrounds the first component, and
      the inlet accommodates at least a portion of the accommodation part.

15. The electronic device of claim 14, wherein
    the thermal interface material is spaced apart from the base plate and the cover plate by the accommodation part.

16. The electronic device of claim 14, wherein
the accommodation part is provided with a first side of the accommodation part attached to the heat conduction plate and a second side of the accommodation part contacting the base plate.

17. The electronic device of claim 14, wherein
the printed circuit board structure further comprises:
   a second component in the space, and
at least a portion of the accommodation part is between the first component and the second component.

18. An electronic device comprising:
a printed circuit board structure comprising:
   a base plate;
   a first component on the base plate;
   a second component on the base plate and apart from the first component;
   an interposer body connected to the base plate and surrounding the first component and the second component, and an interposer disposed in the interposer body and including an inlet through which an inner space of the interposer body meets the outside;
a cover plate connected to the interposer and covering the first component and the second component;
a heat conduction plate on the cover plate and facing the first component and the second component;
an accommodation part including an accommodation body and an accommodation head extending from the accommodation body and included inside the inlet, wherein the accommodation body is between the base plate and the heat conduction plate; and
a thermal interface material accommodated in the accommodation part and provided in a solid state by being hardened in the accommodation part.

* * * * *